United States Patent [19]
Eom

[11] Patent Number: 5,817,547
[45] Date of Patent: Oct. 6, 1998

[54] METHOD FOR FABRICATING A METAL OXIDE SEMICONDUCTOR FIELD EFFECT TRANSISTOR HAVING A MULTI-LAYERED GATE ELECTRODE

[75] Inventor: Gum Yong Eom, Kyoungki-do, Rep. of Korea

[73] Assignee: Hyundai Electronics Industries Co., Ltd., Ichon, Rep. of Korea

[21] Appl. No.: 607,641

[22] Filed: Feb. 27, 1996

[30] Foreign Application Priority Data

Feb. 27, 1995 [KR] Rep. of Korea ............... 1995 3905
Apr. 7, 1995 [KR] Rep. of Korea ............... 1995 8126

[51] Int. Cl.⁶ ............... H01L 21/44; H01L 21/48; H01L 21/265
[52] U.S. Cl. ............... 438/142; 438/542; 438/652; 438/660
[58] Field of Search ............... 437/40 GS, 41 GS, 437/101, 162, 189; 257/381, 385

[56] References Cited

U.S. PATENT DOCUMENTS

| | | |
|---|---|---|
| 4,354,309 | 10/1982 | Gardiner et al. ............ 357/23 |
| 4,643,527 | 2/1987 | Magarino et al. ............ 437/101 |
| 5,350,698 | 9/1994 | Huang et al. ............ 437/41 |
| 5,410,174 | 4/1995 | Kalnitsky ............ 257/381 |
| 5,441,904 | 8/1995 | Kim et al. ............ 437/189 |

*Primary Examiner*—Brian Dutton
*Attorney, Agent, or Firm*—Reid & Priest, L.L.P.

[57] ABSTRACT

There is disclosed a method for fabricating a MOSFET, comprising the steps of: forming a gate oxide on a semiconductor substrate; depositing an intrinsic semiconductor layer on said gate oxide; forming a doped semiconductor layer on said intrinsic semiconductor layer; annealing said intrinsic semiconductor layer and said doped semiconductor layer, to diffuse impurities within said doped semiconductor layer into said intrinsic semiconductor layer; and patterning said intrinsic semiconductor layer and said doped semiconductor layer, to form a gate electrode, whereby the property degradation of gate oxide attributable to impurities, the increase in the thickness of gate oxide film attributable to infiltration of impurities and the degradation in operation of device can be prevented.

19 Claims, 5 Drawing Sheets

METHOD FOR FABRICATING A METAL OXIDE SEMICONDUCTOR FIELD EFFECT TRANSISTOR HAVING A MULTI-LAYERED GATE ELECTRODE

BACKGROUND OF THE INVENTION

1. Field of the Invention

The present invention relates, in general, to a method for fabricating a metal oxide semiconductor field effect transistor (hereinafter referred to "MOSFET") and, more particularly, to an improvement in the process yield and reliability of the device operation along with the method.

2. Description of the Prior Art

In general, as semiconductor devices are highly integrated, the gate electrode of MOSFET becomes narrower. If the gate electrode is N-fold decreased in width, its electric resistance is N-fold increased, thereby lowering the operating speed of the semiconductor device.

To reduce the resistance of the gate electrode, polycide, a stack structure of polysilicon and silicide, has recently been suggested as a low resistant gate, in which the characteristics of the interface between polysilicon layer and oxide, showing the most stable MOSFET properties, is used. Also, there is proposed a technology in which a high melt metal layer, such as tungsten, is laid over a polysilicon layer, to form a low resistant gate.

However, the gate electrode prepared by stacking such high melt metal shows significant problems. When the gate electrode is formed, the high melt metal is infiltrated into a gate insulating film by spark, giving rise to an increase in the interface level or fixed charge. In addition, the high melt metal is likely to be oxidized upon high temperature treatment after the formation of the gate electrode.

To avoid such problems, much research has been done, including high purification of the high melt metal, improvement in forming high melt metal, and thermal treatment under $H_2O/H_2$ mix gas to prevent the oxidization of the high melt metal.

High integration of semiconductor devices accompanies a notable increase in device density and switching speed as well as consumption power. To cope with these disadvantages, the design role is required to be less than 0.5 $\mu$m. For such a narrow design role, techniques for forming the swallow junction were introduced with the aim of preventing the short channel effect caused by the lateral diffusion from the diffusion region. In addition, a lightly doped drain (hereinafter referred to as "LDD") in which a source/drain electrode containing a low density impurity region is formed is suggested so as to avert the hot electron effect.

Based on this viewpoint, a conventional fabrication method of MOSFET will be described in connection with FIG. 1, in order to better understand the background of the present invention.

Figure 1A:
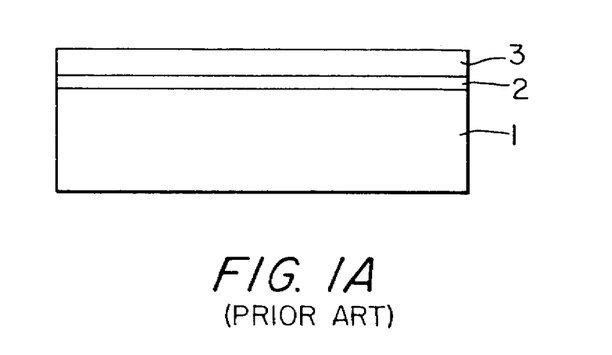
FIGS. 1A to 1C are schematic cross sectional views showing a conventional method for fabricating a MOSFET.

First, as shown in FIG. 1A, on an N or P-type semiconductor substrate 1 is formed a gate oxide 2 which is then covered with a polysilicon layer 3 at approximately 550° to 650° C. by using $SiH_4$ gas.

Figure 1B:
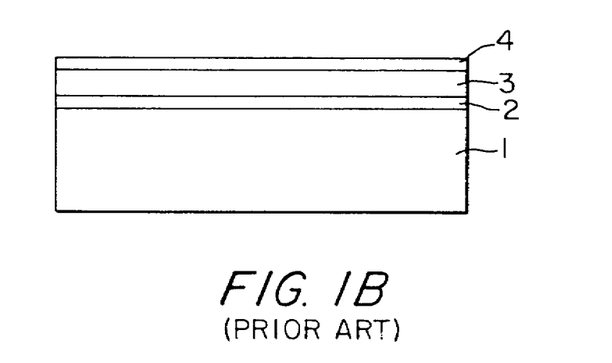

Thereafter, $POCl_3$ is doped at approximately 850° to 950° C. over the polysilicon layer 3, to form a phosphorus-doped silicon layer 4 with the aim of reducing the resistance of the gate electrode, as shown in FIG. 1B. The doping of $POCl_3$ makes phosphorus (P) impurities permeate into the gate electrode 3a by the following reactions:

thereby reducing the sheet resistance value. That is, the phosphorus-doped silicon layer 4 is formed to lower the resistance of the gate electrode. Alternatively, the formation of a tungsten silicide layer on the gate electrode may be done, to reduce the sheet resistance into a lower value.

Figure 1C:
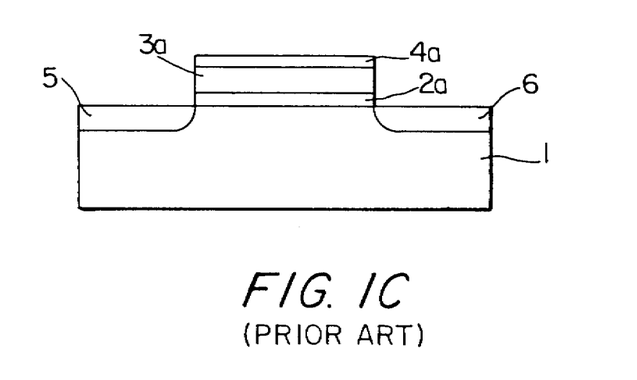

Photolithography and photo etch processes are undertaken to selectively remove the silicide layer 4, the polysilicon layer and the gate oxide 2, resulting in the formation of a gate electrode 3a, as shown in FIG. 1C. While the gate electrode 3a serves as a mask, impurities are implanted into the semiconductor substrate 1, to form source/drain electrodes 5 and 6.

As may be expected, the conventional fabrication method of MOSFET has many significant disadvantages.

For example, when forming the silicide layer, impurities (e.g., P) permeate into the gate oxide and thus deleteriously affect it.

To avoid the permeation of the impurities (e.g., P) into the gate oxide, they may be implanted in a smaller amount. But, in this case, it is virtually impossible to control the sheet resistance value, which has an important influence on the characteristics of the device, so that the reliability in operation is degraded.

On the other hand, when a tungsten silicide layer is formed over the gate electrode, which results in further reducing the sheet resistance of MOSFET as described above, impurities (e.g. F) infiltrate into the gate oxide to thicken the gate oxide by approximately 20%, or serve as a trap site to lower the process yield and reliability in operation.

SUMMARY OF THE INVENTION

Therefore, it is an object of the present invention to overcome the above problems encountered in the prior art and to provide a method for fabricating a MOSFET, which is capable of preventing the infiltration of impurities into a gate oxide, thereby easily controlling the sheet resistance.

It is another object of the present invention to provide a method for fabricating a MOSFET by which process yield as well as reliability in operation can be improved.

In accordance with an aspect of the present invention, there is provided a method for fabricating a metal oxide semiconductor field effect transistor, comprising the steps of: forming a gate oxide on a semiconductor substrate; depositing an intrinsic semiconductor layer on said gate oxide; forming a doped semiconductor layer on said intrinsic semiconductor layer; annealing said intrinsic semiconductor layer and doped semiconductor layer, to diffuse impurities within said doped semiconductor layer into said intrinsic semiconductor layer; and patterning said intrinsic semiconductor layer and doped semiconductor layer, to form a gate electrode.

In accordance with another aspect of the present invention, there is provided a method for fabricating a MOSFET, comprising the steps of: forming a gate oxide on a semiconductor substrate; depositing an intrinsic semiconductor layer on said gate oxide; forming an oxide on said intrinsic semiconductor layer; depositing a doped semiconductor layer on said oxide; and patterning said doped semiconductor layer, said oxide and said intrinsic semiconductor layer, to form a gate electrode.

In accordance with still another aspect of the present invention, there is provided a method for fabricating a MOSFET, comprising the steps of: forming a gate oxide on a semiconductor substrate; depositing a first intrinsic semiconductor layer on said gate oxide; depositing a first doped semiconductor layer on said first intrinsic semiconductor layer; depositing a second intrinsic semiconductor layer on said first doped semiconductor layer; depositing a second doped semiconductor layer on said second intrinsic semiconductor layer; subjecting said semiconductor layers to thermal treatment, to diffuse impurities from said first and second doped semiconductor layers into the first and second intrinsic semiconductor layers; and patterning said semiconductor layers, to form a gate electrode.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

The application of the preferred embodiments of the present invention is best understood with reference to the accompanying drawings, wherein like reference numerals are used for like and corresponding parts, respectively.

Figure 2A:
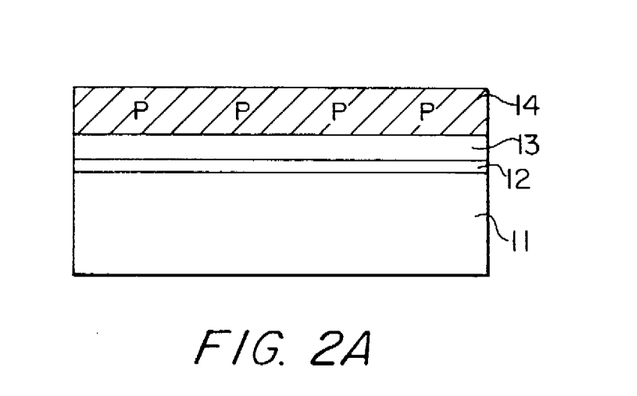
FIGS. 2A to 2C are schematic cross sectional views showing a method for fabricating a MOSFET in accordance with a first embodiment of the present invention.
Figure 2B:
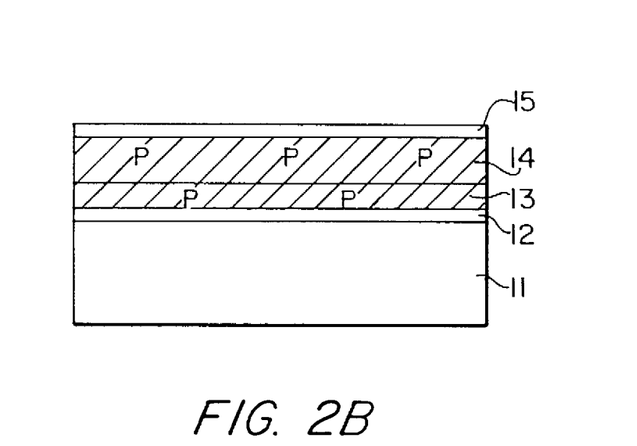
Figure 2C:
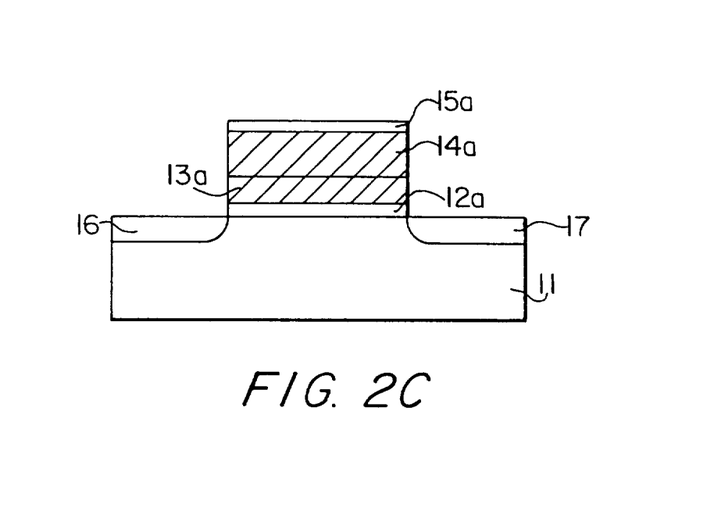

FIGS. 2A to 2C show the preferred process steps of fabricating a MOSFET in accordance with a first embodiment of the present invention. These steps will be described in connection with FIGS. 1A to 1C.

First, as shown in FIG. 2A, a gate oxide 12 is formed at a thickness of approximately 70 to 150 Angstrom on an N or P type semiconductor substrate 11, followed by the formation of a first polysilicon layer 13 over the gate oxide 12. This is carried out by using $SiH_4$ gas at approximately 500° to 700° C. It is preferred that the first polysilicon layer 13 is approximately 300 to 1,000 Angstrom thick.

Subsequently, at a temperature of approximately 500° to 700° C., a second polysilicon layer 14 doped with impurities is formed on the first polysilicon layer 13 by use of $Si_2H_6$ gas. The thickness of the second polysilicon layer 14 is preferably on the order of approximately 700 to 2,000 Angstrom.

Only in the upper or the lower one third of the second polysilicon layer 14 are doped the impurities. Alternatively, they may be doped only in the middle part of the second polysilicon layer 14 and then diffused out by thermal treatment. The doping of impurities in the second polysilicon layer can be achieved by injecting a gas mixture of $PH_3$ and $N_2$ and going through the reaction: $PH_3 \rightarrow 2P + 3H_2$.

On the other hand, in lieu of polysilicon, amorphous silicon may be used for the first and second polysilicon layers 13 and 14. In this case, after being deposited, amorphous silicon layers are converted to polysilicon by a subsequent thermal treating process.

It is important that the first polysilicon layer 13 has a slightly smaller grain boundary than the second polysilicon layer 14 does.

Second, with reference to FIG. 2B, the first and second polysilicon layers 13 and 14 are annealed at a temperature of approximately 600° to 700° C. At this time, the impurities within the second polysilicon layer 14 are diffused into the first polysilicon layer 13 through this annealing.

Because the impurities are doped in only both an upper and lower region of the second polysilicon layer 14, the impurity amount to be diffused into the gate oxide can be reduced by appropriately adjusting the extent of the doping.

Then, a tungsten silicide layer 15 is formed over the second polysilicon layer 14. This is done through the following reaction:

$$7SiH_2Cl_2 + 2WF_6 \rightarrow 2WSi_2 + 3SiF_4 + 14H_2$$

In the above reaction, it is difficult for the F component to infiltrate into the gate oxide 12 due to the size difference in the grain boundary between the first and second polysilicon layers 13 and 14.

As shown in FIG. 2C, the tungsten silicide layer 15 and the first and second polysilicon layers 13 and 14 are selectively removed by photolithography and photo etch processes, to form gate electrodes 13a and 14a.

These electrodes show a sheet resistance of approximately 50 Ω/□ and approximately 25–40Ω/□, respectively, when each of them is approximately 2,000 Angstrom thick. The sheet resistance can be reduced to approximately 10 to 20Ω/□ in the presence of the tungsten silicide layer 15a. Under certain circumstances, the silicide layer 15a may not be formed.

Finally, the fabrication of the semiconductor device is completed by ion-implantation of impurities into the semiconductor substrate 11 to form source/drain electrodes 16 and 17, with the gate electrodes 13a and 14a serving as a mask.

Figure 3A:
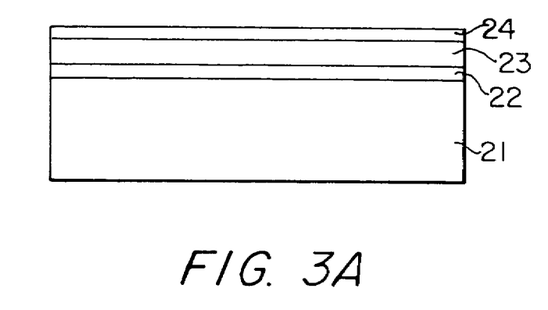
FIGS. 3A to 3C are schematic cross sectional views showing a method for fabricating a MOSFET in accordance with a second embodiment of the present invention.
Figure 3B:
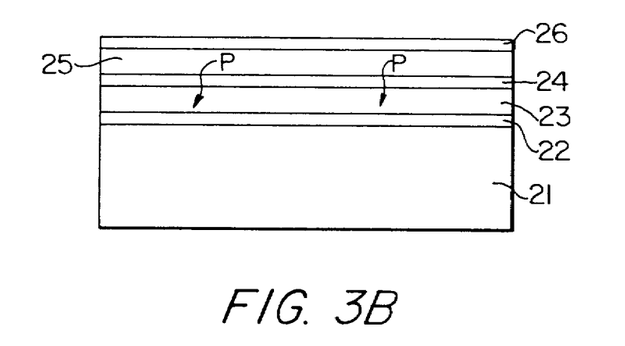
Figure 3C:
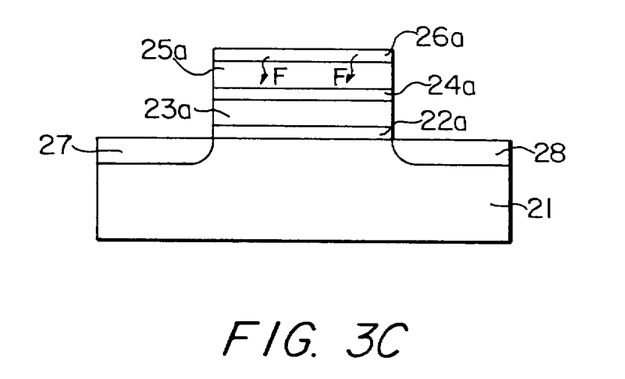

Referring to FIGS. 3A to 3C, there are cross sections that show a fabrication method of MOSPET according to a second embodiment of the present invention.

First, as shown in FIG. 3A, a gate oxide 22 is formed at a thickness of approximately 70 to 150 Angstrom on an N or P type semiconductor substrate 21, followed by the formation of a first polysilicon layer 23 over the gate oxide 22. This is carried out by using $SiH_4$ gas at approximately 500° to 700° C. It is preferred that the first polysilicon layer 23 is approximately 300 to 1,000 Angstrom thick. Also, it preferably has a grain boundary smaller than that of a second polysilicon layer 25 to be formed later.

Then, the first polysilicon layer 23 is thermally treated at approximately 450° to 550° C. for 5 to 20 min, to form an oxide 24 approximately 20 Angstrom thick. At this time, the oxide 24 is grown under an $O_2$ gas with approximately 2–4 SLPM or an $H_2/O_2$ mix gas with approximately half an SLPM.

This oxide 24 defines the grain boundary of the first polysilicon layer 23 and fixes a new boundary with a subsequently stacked film.

As shown in FIG. 3B, a second polysilicon layer 25 doped with impurities is formed on the oxide film 24 by use of $Si_2H_6$ gas at a temperature of approximately 500° to 700° C. The thickness of the second polysilicon layer 25 is preferably on the order of approximately 700 to 2,000 Angstrom.

$Si_2H_4$ gas is superior to $SiH_4$ in physical thermal absorption and thereby can form a relatively large grain boundary.

Under a temperature of approximately 600° to 700° C., the first and second polysilicon layers 23 and 25 are annealed in such a manner that the impurities of the second polysilicon layer 25 should be diffused into the first polysilicon layer 23.

Because the impurities are doped only in the second polysilicon layer 25, the impurity amount to be diffused into the gate oxide 22 can be reduced by appropriately adjusting the extent of the doping.

On the other hand, in place of polysilicon, amorphous silicon may be used for the first and second polysilicon layers 23 and 25. In this case, after being deposited, amorphous silicon layers are polysiliconized by a subsequent thermal treating process.

Thereafter, a tungsten silicide layer 26 is formed over the second polysilicon layer 25. This is done through the following reaction:

$7SiH_2Cl_2 + 2WF_6 \rightarrow 2WSi_2 + 3SiF_4 + 14H_2$

Since the infiltration path is shortened due to the difference in the grain boundary between the first and second polysilicon layers 23 and 25, it is difficult for the F component or the by-product, such as $H_2$ or $H_2O$, to infiltrate into the gate oxide 22. Under certain circumstances, the tungsten silicide layer 26 may not be formed.

As shown in FIG. 3C, the tungsten silicide layer 26 and the first and second polysilicon layers 23 and 25 are selectively removed by photolithography and photo etch processes, to form gate electrodes 23a and 25a.

These electrodes show a sheet resistance of approximately 50Ω/□ and approximately 25–40Ω/□, respectively, when each of them is 2,000 Angstrom thick. The sheet resistance can be reduced to approximately 10 to 20Ω/□ in the presence of the silicide layer 26a.

The fabrication of the semiconductor device is completed by ion-implantation of impurities into the semiconductor substrate 21 to form source/drain electrodes 27 and 28, with the gate electrodes 23a and 25a serving as a mask.

Figure 4A:
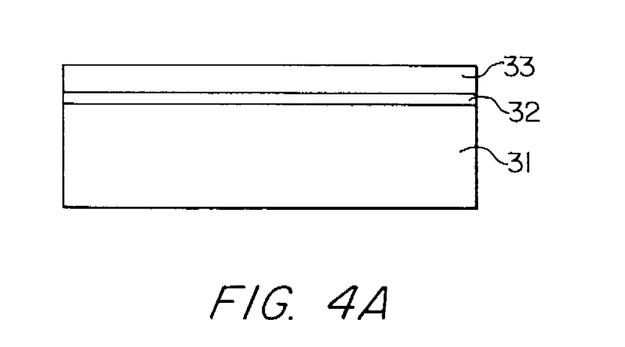
FIGS. 4A to 4C are schematic cross sectional views showing a method for fabricating a MOSFET in accordance with a third embodiment of the present invention.
Figure 4B:
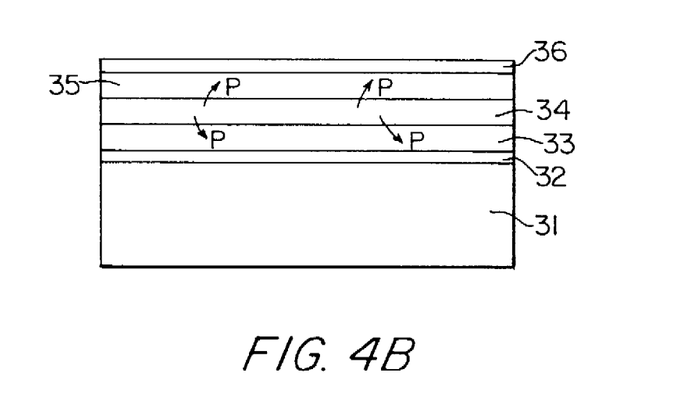
Figure 4C:
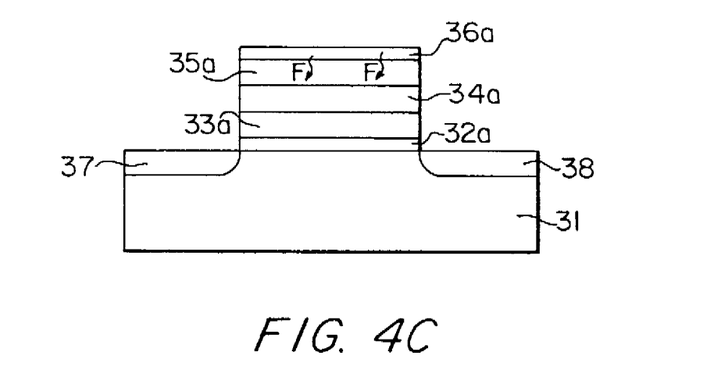

With reference to FIGS. 4A to 4C, there are shown a method for fabricating a MOSFET according to a third embodiment of the present invention.

First, as shown in FIG. 4A, a gate oxide 32 is initially formed approximately 70 to 150 Angstrom thick on an N or P type semiconductor substrate 31. Then, at a temperature of 500° to 700° C., a first polysilicon layer 33 is formed over the gate oxide 32 by using $SiH_4$ gas. It is preferred that the first polysilicon layer 33 is approximately 300 to 1,000 Angstrom thick. Also, it preferably has a grain boundary larger than that of a second polysilicon layer 34 to be formed later.

As shown in FIG. 4B, a second polysilicon layer 34 doped with impurities is formed on the first polysilicon layer 33 by use of $Si_2H_6$ gas at a temperature of approximately 500° to 700° C. The thickness of the second polysilicon layer 34 is preferably on the order of approximately 700 to 2,000 Angstrom. $Si_2H_4$ gas is superior to $SiH_4$ in physical thermal absorption and thereby can form a relatively large grain boundary.

Subsequently, similar to the second polysilicon layer 34, a third polysilicon layer 35 is formed over the second polysilicon layer 34 at 500° to 700° C. by use of $Si_2H_6$ gas, with a preferable thickness ranging from approximately 700 to 2,000 Angstrom.

The first, second and third polysilicon layers 33, 34 and 35 are subjected to annealing at 600° to 700° C., through which the impurities within the second polysilicon layer 34 are diffused into the first and third polysilicon layers 33 and 35.

Because the impurities are doped only in the second polysilicon layer 34, the impurity amount to be diffused into the gate oxide 32 can be reduced by appropriately adjusting the extent of the doping.

On the other hand, in place of polysilicon, amorphous silicon may be used for the first, second and third polysilicon layers 33, 34 and 35. In this case, the amorphous silicon layers deposited must be thermally treated for polysiliconization.

Thereafter, a tungsten silicide layer 36 is formed over the second polysilicon layer 25. This is done through the following reaction:

$7SiH_2Cl_2 + 2WF_6 \rightarrow 2WSi + 3SiF_4 + 14H_2$

Since the infiltration path is shortened due to the differences in grain boundary between the first and second polysilicon layers 33 and 34 and between the second and third polysilicon layers 34 and 35, it is difficult for the F component or the by-product, such as $H_2$ or $H_2O$, to infiltrate into the gate oxide film 32. Under ceratin circumstances, the tungsten silicide layer 36 may not be formed.

Alternatively, in order to definitely fix the difference in grain boundary between the respective layers, an oxide with a thickness of approximately 20 Angstrom or less may be formed between the first and second polysilicon layers 33 and 34 and/or between the second and third polysilicon layers 34 and 35.

As shown in FIG. 4C, photolithography and photo etch processes are undertaken to selectively remove the tungsten silicide layer 36 and the first, second and third polysilicon layers 33, 34 and 35, resulting in the formation of gate electrodes 33a, 34a and 35a.

The fabrication of the semiconductor device is completed by ion-implantation of impurities into the semiconductor substrate 31 to form source/drain electrodes 37 and 38, with the gate electrodes 33a, 34a and 35a serving as a mask.

Figure 5A:
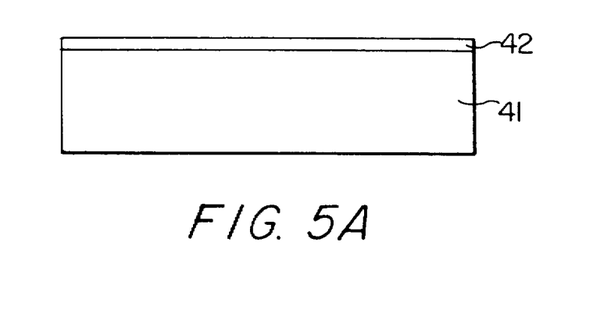
FIGS. 5A to 5C are schematic cross sectional views showing a method for fabricating a MOSFET in accordance with a fourth embodiment of the present invention.
Figure 5B:
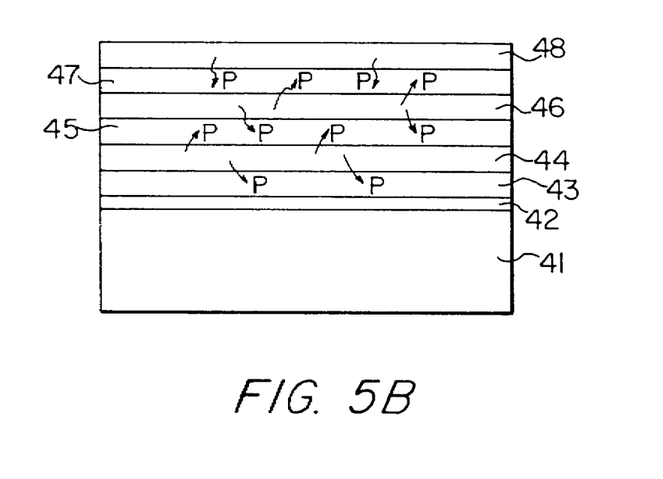
Figure 5C:
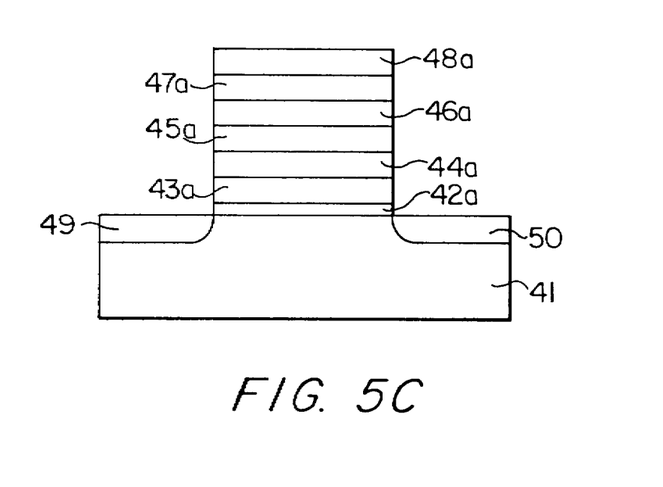

With reference to FIGS. 5A to 5C, there are cross sections that show a fabrication method of MOSFET according to a fourth embodiment of the present invention.

First, as shown in FIG. 5A, a gate oxide 42 is formed at a thickness of approximately 70 to 150 Angstrom on an N or P type semiconductor substrate 41.

As shown in FIG. 5B, at approximately 500° to 700° C., first, second, third, fourth, fifth and sixth amorphous silicon layers 43, 44, 45, 46, 47 and 48 are sequentially formed over the gate oxide 42. This sequential formation is carried out by using $SiH_4$ gas with 200 to 300 SCCM and $N_2$ gas with 1.5 to 2 SCCM. The even-numbered amorphous silicon layers, that is, the second, fourth and sixth polysilicon layers 44, 46 and 48 comprise impurities (P) and are formed by using $Si_2H_6$ at approximately 200 to 300 SCCM, $PH_3$ at approximately 250 to 300 SLPM and $N_2$ gas at approximately 1.5 to 2 SLPM.

Then, the first to sixth amorphous silicon layers 43 to 48 are annealed at approximately 600° to 700° C. This thermal treatment allows the impurities within the second, fourth and sixth amorphous silicon layers 44, 46 and 48 to diffuse into the first, third and fifth amorphous silicon layers (43), (45) (47). Therefore, the first, third and fifth silicon layers 43, 45 and 47 as well as the six amorphous silicon layers are polysiliconized.

As shown in FIG. 5C, the first, second, third, fourth, fifth and sixth polysilicon layers 43, 44, 45, 46, 47 and 48 thus obtained are selectively removed by photolithography and photo etch processes, to form gate electrodes 43a, 44a, 45a, 46a, 47a and 48a.

The fabrication of the semiconductor device is completed by ion-implantation of impurities into the semiconductor substrate 41 to form source/drain electrodes 49 and 50, with the gate electrodes 43a, 44a, 45a, 46a, 47a and 48a serving as a mask.

As illustrated hereinbefore, the fabrication methods of MOSFET according to the present invention have the following effects.

First, the impurities doped in the impurity silicon layer are prevented from infiltrating into the gate oxide by sequentially stacking intrinsic silicon layer and doped silicon layers over the gate oxide, thereby improving the reliability of the gate oxide.

Also, when forming the tungsten silicide layer, the impurities cannot infiltrate into the gate oxide by virtue of the difference in grain boundary between the polysilicon layers. Thus, the thickening of the gate oxide and the formation of a trap site are prevented, which results in the avoidance of leakage current.

This oxide layer may be formed between a polysilicon layer with a greater grain boundary and a polysilicon layer with a smaller grain boundary, defining the difference in grain boundary therebetween. A plurality of amorphous silicon layers are, in sequence, formed and then annealed to be polysiliconized. These processes can reduce the sheet resistance as well as narrow the infiltration path of the impurities.

Therefore, the method for fabricating MOSFET according to the present invention can prevent degradation in the properties of the gate oxide attributable to impurities, an increase in thickness of the gate oxide, and degradation in device operation attributable to a trap site, and thus improve the process yield and the reliability in operation of the semiconductor device.

Other features, advantages and embodiments of the present invention disclosed herein will be readily apparent to those exercising ordinary skill after reading the foregoing disclosures. In this regard, while specific embodiments of the invention have been disclosed in considerable detail, variations and modifications of these embodiments can be effected without departing from the scope and spirit of the invention as described in the accompanying claims.

What is claimed is:

1. A method for fabricating a metal oxide semiconductor field effect transistor, comprising the steps of:

forming a gate oxide on a semiconductor substrate;

depositing a intrinsic semiconductor layer on said gate oxide;

forming a doped semiconductor layer on said intrinsic semiconductor layer;

annealing said intrinsic semiconductor layer and said doped semiconductor layer, to diffuse impurities within said doped semiconductor layer into said intrinsic semiconductor layer;

patterning said intrinsic semiconductor layer and said doped semiconductor layer, to form a gate electrode; and wherein said gate oxide, said intrinsic semiconductor layer and said doped semiconductor layer have a thickness of approximately 70 to 150 Angstrom, approximately 300 to 1,000 Angstrom, and approximately 700 to 2,000 Angstrom, respectively.

2. The method in accordance with claim 1, further comprising the step of forming a tungsten silicide layer on said doped semiconductor layer before said patterning step.

3. The method in accordance with claim 1, wherein said intrinsic semiconductor layer and said doped semiconductor layer are made of any one selected from polysilicon and amorphous silicon.

4. The method in accordance with claim 3, wherein said amorphous silicon is converted to polycrystalline silicon by thermal treatment.

5. The method in accordance with claim 1, wherein said intrinsic semiconductor layer and said doped semiconductor layer are formed at a temperature of approximately 400° to 600° C.

6. The method in accordance with claim 1, wherein said intrinsic semiconductor layer is formed by using $Si_2H_6$ at approximately 200 to 300 SCCM and $N_2$ gas at approximately 1.5 to 2 SLPM.

7. The method in accordance with claim 1, wherein said impurity semiconductor layer is formed by using $Si_2H_6$ at approximately 200 to 300 SCCM, $PH_3$ at approximately 250 to 300 SLPM and $N_2$ gas at approximately 1.5 to 2 SLPM.

8. The method in accordance with claim 1, wherein said annealing step is carried out at a temperature of approximately 600° to 800° C.

9. A method for fabricating a metal oxide semiconductor field effect transistor, comprising the steps of:

forming a gate oxide on a semiconductor substrate;

forming a plurality of intrinsic semiconductor layers and a plurality of doped semiconductor layers, said intrinsic semiconductor layers alternating with said doped semiconductor layers, on said gate oxide;

forming a doped semiconductor layer on said intrinsic semiconductor layer;

annealing said intrinsic semiconductor layers and said doped semiconductor layers, to diffuse impurities within said doped semiconductor layers into said intrinsic semiconductor layers;

patterning said intrinsic semiconductor layers and said doped semiconductor layers, to form a gate electrode.

10. A method for fabricating a metal oxide semiconductor field effect transistor, comprising the steps of:

forming a gate oxide on a semiconductor substrate;

depositing a first intrinsic semiconductor layer on said gate oxide;

depositing a first doped semiconductor layer on said first intrinsic semiconductor layer;

depositing a second intrinsic semiconductor layer on said second intrinsic semiconductor layer;

subjecting said first and second intrinsic and first and second doped semiconductor layers to thermal treatment, to diffuse impurities from said first and second doped semiconductor layers into the first and second intrinsic semiconductor layers; and patterning the semiconductor layers obtained from said step of subjecting said first and second intrinsic and first and second doped semiconductor layers to thermal treatment, to form a gate electrode.

11. The method in accordance with claim 10, wherein said semiconductor layers are made from either polysilicon or amorphous silicon.

12. The method in accordance with claim 11, wherein said polysilicon layers are annealed at a temperature of approximately 400° to 600° C.

13. The method in accordance with claim 11, wherein said amorphous silicon is polysiliconized by thermal treatment at a temperature of approximately 600° to 800° C. under an $N_2$ atmosphere.

14. The method in accordance with claim 10, further comprising the step of forming an oxide in each of the interfaces between said first intrinsic semiconductor layer and said first doped semiconductor layer, said first doped semiconductor layer and said second intrinsic layer, and said second intrinsic layer and said second doped layer.

15. The method in accordance with claim 10, further comprising the step of forming a tungsten silicide layer on said second doped semiconductor layer, before said patterning step.

16. A method for fabricating a metal oxide semiconductor field effect transistor, comprising the steps of:

forming a gate oxide on a semiconductor substrate;

depositing a intrinsic semiconductor layer on said gate oxide;

forming a doped semiconductor layer on said intrinsic semiconductor layer;

annealing said intrinsic semiconductor layer and said doped semiconductor layer, to diffuse impurities within said doped semiconductor layer into said intrinsic semiconductor layer;

patterning said intrinsic semiconductor layer and said doped semiconductor layer, to form a gate electrode, and wherein said intrinsic semiconductor layer is formed by using $Si_2H_6$ at approximately 200 to 300 SCCM and $N_2$ gas at approximately 1.5 to 2 SLPM.

17. The method of claim 16, wherein said annealing step is carried out at a temperature of approximately 600° to 800° C.

18. The method of claim 16, further comprising the step of forming a tungsten silicide layer on said doped semiconductor layer before said patterning step.

19. The method in accordance with claim 16, wherein said gate oxide, said intrinsic semiconductor layer and said doped semiconductor layer have a thickness of approximately 70 to 150 Angstrom, approximately 300 to 1,000 Angstrom, and approximately 700 to 2,000 Angstrom, respectively.

* * * * *